United States Patent [19]

Phy

[11] 4,390,598
[45] Jun. 28, 1983

[54] LEAD FORMAT FOR TAPE AUTOMATED BONDING

[75] Inventor: William S. Phy, Los Altos Hills, Calif.

[73] Assignee: Fairchild Camera & Instrument Corp., Mountain View, Calif.

[21] Appl. No.: 365,686

[22] Filed: Apr. 5, 1982

[51] Int. Cl.³ .......................................... H01L 23/48
[52] U.S. Cl. .................................. 428/577; 428/596; 357/69
[58] Field of Search ............... 428/577, 596, 597, 134, 428/136; 357/70, 69; 267/181; 188/371; 403/2; 339/17 CF, 17 F, 9 E, 9 R; 174/13, 99 E, 69; 338/316

[56] References Cited

U.S. PATENT DOCUMENTS

| | | | |
|---|---|---|---|
| 3,422,213 | 1/1969 | Webb | 174/71 R |
| 3,809,800 | 5/1974 | Fletcher | 174/69 |
| 3,905,038 | 9/1975 | Beyerlein | 357/70 |
| 3,947,867 | 3/1976 | Duffek | 357/70 |
| 4,109,096 | 8/1978 | Dehaine | 357/70 |
| 4,331,740 | 5/1982 | Burns | 357/70 |

Primary Examiner—L. Dewayne Rutledge
Assistant Examiner—J. J. Zimmerman
Attorney, Agent, or Firm—Kenneth Olsen; Michael J. Pollock; Theodore Scott Park

[57] ABSTRACT

A lead frame (20) for tape automated bonding includes individual leads (12) each having a stretch loop (40) to accommodate elongation of the loop as the lead is bonded to a substrate (28) after inner lead bonds have been formed to an integrated circuit (26). Such a lead frame allows temporary connection and testing of the circuit prior to final lead formation and packaging.

16 Claims, 17 Drawing Figures

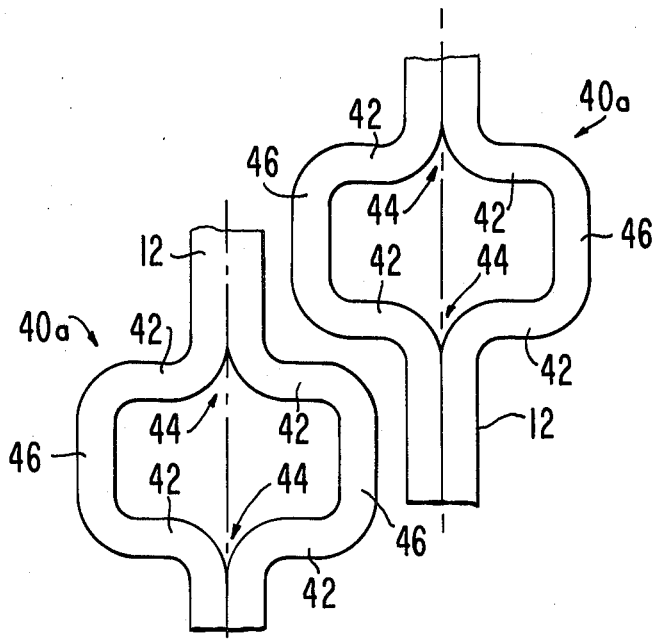
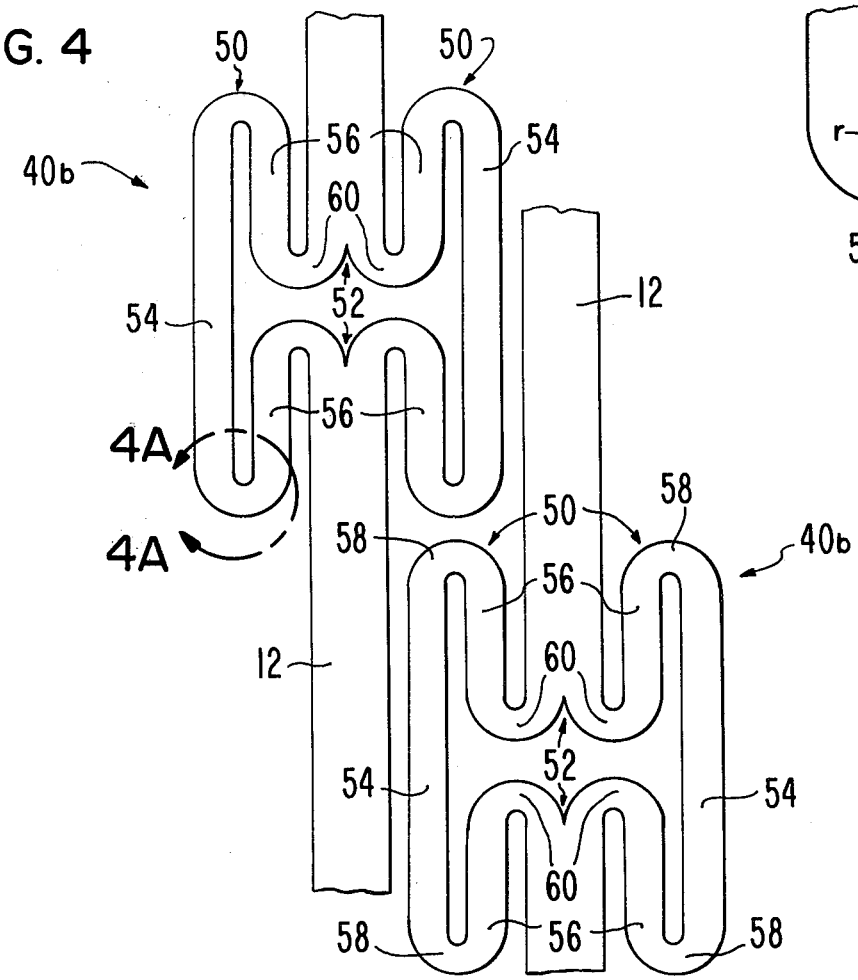
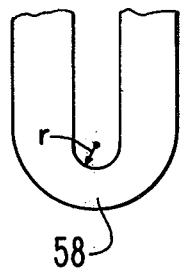

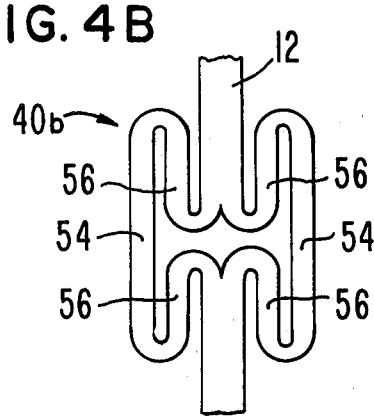
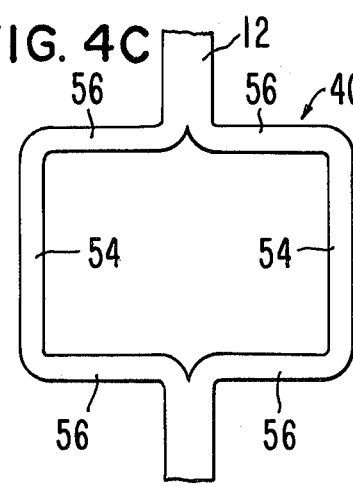
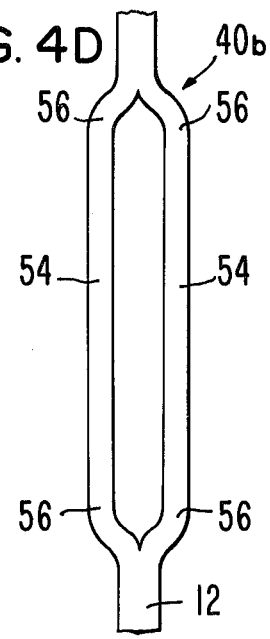
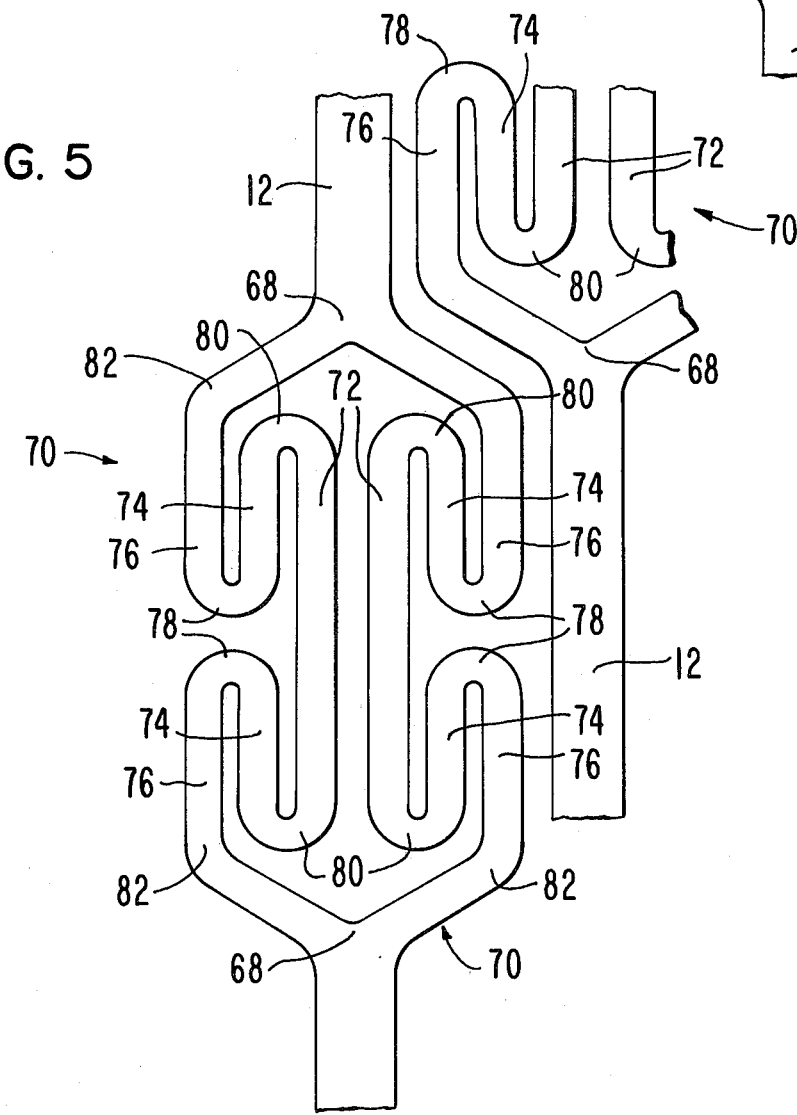

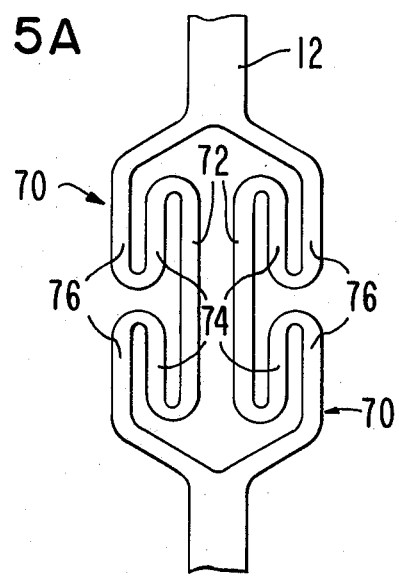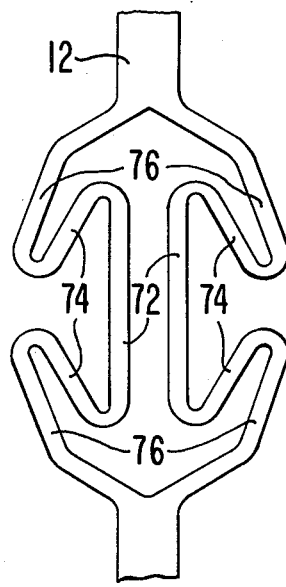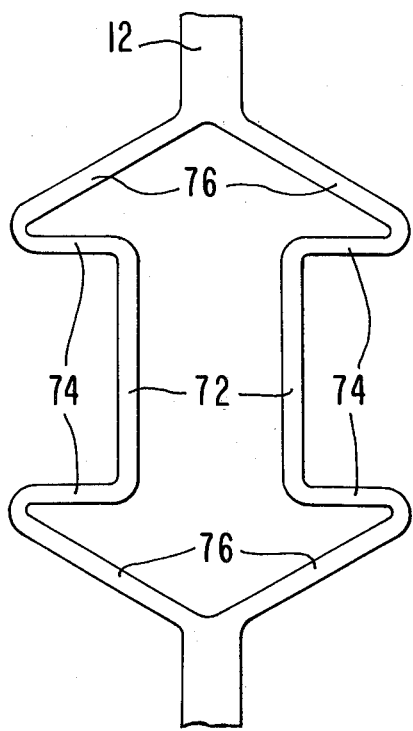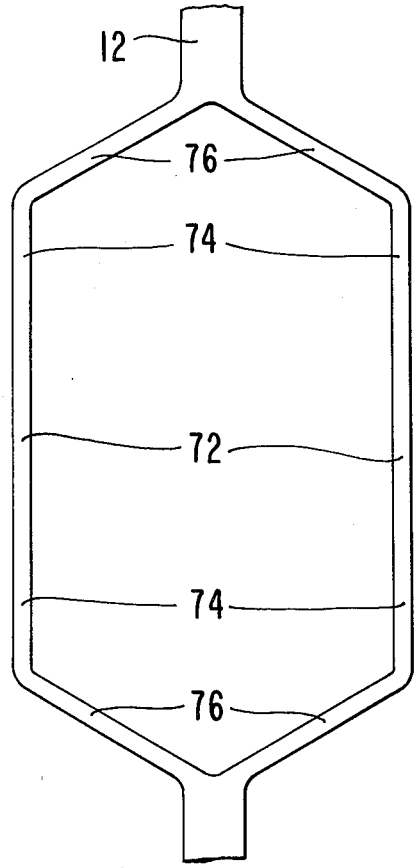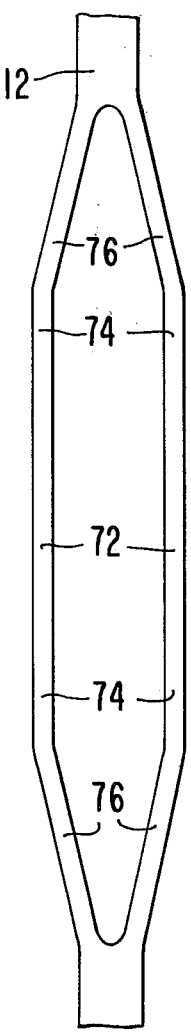

LEAD FORMAT FOR TAPE AUTOMATED BONDING

BACKGROUND OF THE INVENTION

1. Field of the Invention

The present invention relates generally to packages for integrated circuits, and more particularly to a lead frame format which allows inner lead attachment to a die prior to outer lead attachment to a substrate.

2. Description of the Prior Art

In the manufacture of integrated circuits, silicon wafers containing many separate integrated circuits are fabricated and then cut into individual circuits, each known as a die. Each die is individually packaged, using any one of a variety of known techniques. During packaging, electrically conductive leads are attached to the die, typically by well-known techniques, such as wire bonding or tape-automated bonding. The assembly of the die and the conductive leads is then usually encapsulated in epoxy or some other enclosure for protection.

Tape-automated bonding is a technique for interconnecting an integrated circuit to leads fabricated on a continuous carrier film. The tape is typically a laminate of copper and a plastic insulator, and the leads are etched in the copper while on the plastic carrier using conventional techniques. The film is perforated along one or both edges with sprocket holes used for advancement and registration.

Each pattern of leads, referred to as a frame, includes a central window or opening through the carrier film. The inner ends of the leads overhang the central opening and may be mass bonded to an integrated circuit which is brought into close proximity with the opening, typically by thermocompression, ultrasonic, eutectic, or reflow solder techniques. The outer portion of each lead is connected to a substrate onto which the die is also mounted, and the plastic carrier is excised from the leads prior to final packaging of the device.

It is desirable to test the individual integrated circuits prior to final packaging. It is particularly desirable to test the devices while still attached to the plastic carrier film and prior to final attachment of the lead frame to the substrate. One such testing method is achieved by first bonding the inner ends of the individual leads to the integrated circuit. The circuit is then carried by the carrier film to a testing station where a conventional probe may be attached to the circuit. After the circuit has been tested and found to meet specifications, the device may be bonded to a substrate by conventional means.

Typically, the outer portions of the leads (which are still attached to the carrier film) are formed downward and bonded to the substrate while the inner ends of the lead remain attached to the die. Thus, each lead must have the ability to stretch as the offset introduced by the thickness of the integrated circuit changes the distance between the inner bonding point of the lead and the position of the outer lead on the tape.

Heretofore, the ability to stretch has been provided by a stretch loop comprising a rectangular segment built into the lead, which loop collapses as the lead is elongated by the offset (see FIG. 3). While generally successful, such rectangular stretch loops are much wider than the lead itself and thus prevent close packing of the leads, which inhibits the application of the above-described technique on high lead count devices.

SUMMARY OF THE INVENTION

The present invention provides a novel stretch loop which allows tape automated bonding of high lead count devices where the leads may be attached to the device prior to offsetting the leads to bond them to a substrate. The stretch loop includes two forks which define a pair of branches, each branch being characterized by a plurality of segments aligned axially with the lead. By providing that the sum of the length of such segments is greater than the distance between the forks, the lead may be extended by a distance greater than the width of the stretch loop. Preferably, each branch comprises a plurality of axially aligned segments which are connected by relatively short lateral (i.e. perpendicular to the axis of the lead) segments so that the ratio of extended length to width is at least two, usually three to four.

BRIEF DESCRIPTION OF THE DRAWINGS

FIG. 3 illustrates the prior art stretch loop.

FIG. 4 illustrates a first embodiment of the stretch loop of the present invention.

FIG. 4A illustrates an arcuate connecting section in detail.

FIGS. 4B-4D illustrate the manner in which the stretch loop of FIG. 4 unfolds as the lead is elongated.

FIG. 5 illustrates a second embodiment of the stretch loop of the present invention.

FIGS. 5A-5E illustrate the manner in which the stretch loop of FIG. 5 unfolds as the lead is elongated.

DESCRIPTION OF THE PREFERRED EMBODIMENTS

Figure 1:
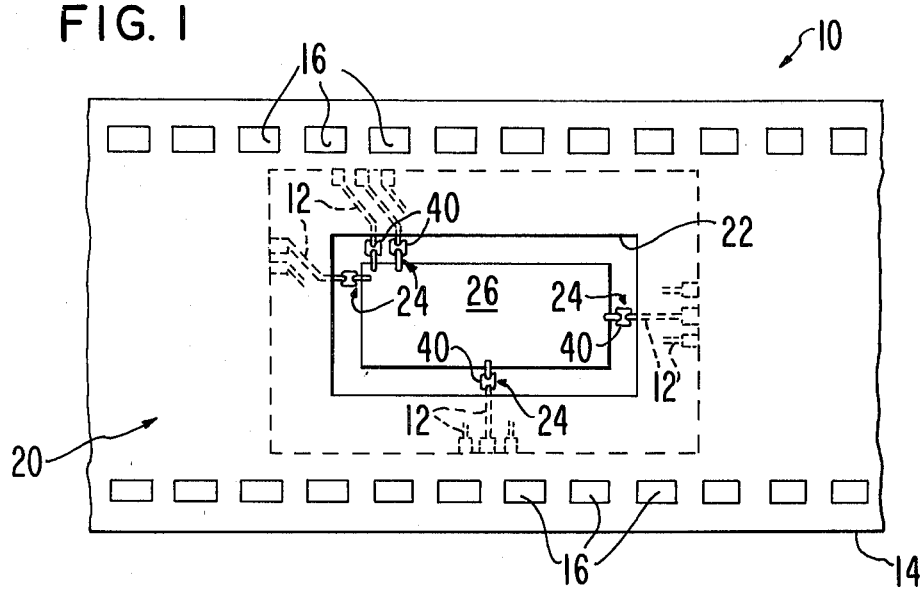
FIG. 1 is a view of a tape comprising a carrier film having the leads of the present invention positioned above an integrated circuit prior to bonding of the leads to a substrate.

Referring to FIG. 1, a tape 10 comprises a plurality of electrically-conductive leads 12 laminated to the underside (as viewd in FIG. 1) of a carrier film 14. The leads 12 are typically formed from copper, and conventional circuit board processes are used to etch a copper layer laminated to the film 14 into the desired pattern of leads. The film 14 is typically formed from glass fiber or a synthetic polymer. It is desirable that the polymer be heat and chemical resistant to withstand the various processing steps required in formation of the tape and connection of the leads 12 to an integrated circuit 26. Preferred polymers include Mylar ® (polyester), and polyvinyl chloride. Particularly preferred are polyimides. The film 14 includes sprocket holes 16 along both edges for use in advancement and registration of the film.

The tape 10 includes a plurality of frames 20 defined by a central opening 22 penetrating the carrier film 14 at a location typically mid-way between the edges. The frame 20 is further defined by the plurality of leads 12 which encompass the periphery of the opening 22, each extending inward a short distance into the opening. As will be described in more detail hereinafter, the portion 24 of each lead 12 which extends into the opening 22 is eventually bonded to the integrated circuit die 26 which is brought into position beneath the opening 22.

Figure 2A:
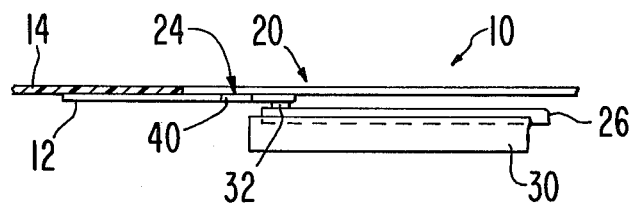
FIGS. 2A-2C are partial elevational views illustrating the elongation of the stretch loop of the present invention when the lead is offset.

Referring to FIGS. 2A–2D, the integrated circuit die 26 is bonded to a substrate 28 in a multi-step operation, as will now be described. Initially, the integrated circuit 26 is held in a wax form 30, as illustrated in FIG. 2A. The integrated circuit 26 is brought into contact with the tape 10 at the appropriate frame 20 so that the outer portions 24 of the leads 12 contact bumps 32 formed on the upper surface (as viewed in the Drawings) of the circuit 26. Although only a single lead 12 and bump 32 are illustrated in FIGS. 2A–2D, it is to be understood that the integrated circuit 26 includes a plurality of bumps 32 corresponding to the number of electrical contacts in the particular integrated circuit, and that for the most part each bump 32 will have a corresponding electrical lead 12 to which it will be attached. The bumps 32 are typically formed from a gold/tin alloy which may be thermally bonded to the leads 12 in a conventional manner, typically by thermocompression, ultrasonic, eutectic or reflow solder techniques. The heat from the bonding will melt the wax form 30 and allow the tape 10 to carry the die 26 upward and away.

After the integrated circuit 26 has been bonded to the leads 12, and before the circuit is mounted on the substrate 28 (as will be shown hereinafter), the circuit may be tested by a conventional techniques. Testing at this stage of assembly is particularly convenient since the circuits are still mounted on the tape and may be sequentially screened as part of the assembly procedure. Moreover, the circuits have been bonded to the lead frame and any damage which may have resulted from such handling and bonding will be uncovered in the screening.

Figure 2B:
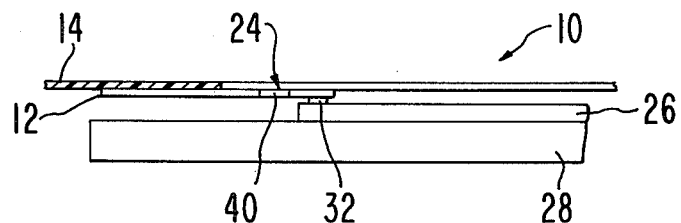

After the integrated circuit 26 has been tested and found functional, the circuit will be typically mounted on the substrate 28 to form a conventional package. As shown in FIG. 2B, the circuit 26 is brought into position so that it lies adjacent the proper position on the substrate 28 and is connected using any conventional technique. Typically, a thin layer of conductive polyimide paste is placed on the substrate and the entire assembly is heated sufficiently to cure the paste and secure the die 26 to the substrate 28.

Figure 2C:
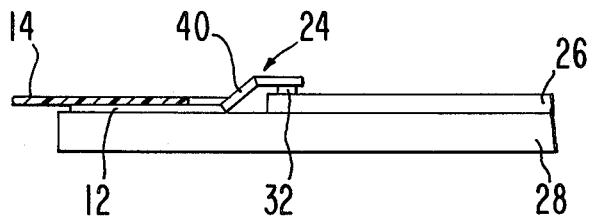

Conveniently, before the assembly of the substrate 28 and the die 26 is heated, the leads 12 will be formed downward and attached to the substrate 28, as illustrated in FIG. 2C. The outer portions of the leads 12 are bonded to the substrate 28 by conventional means, typically using gold-tin reflow techniques. It is preferred to form the leads 12 and bond both the leads and the die 26 to the substrate 28 in a single step, although the order and manner of bonding the various components is not critical.

Referring now to both FIGS. 1 and 2A–2D, stretch loops 40 are provided in the inner portions 24 of each lead 12 so that the lead is capable of elongating as the lead is formed downward onto the substrate 28. As best observed in FIGS. 2B and 2C, each lead 12 is vertically offset as the outer portion of the lead is pressed downward and bonded to the substrate 28. Since the inner portion 24 of the lead 12 has already been bonded to the metalic bump 32, and the outer portion is laminated to the carrier film 14, the lead must include a portion which is capable of stretching to accomodate the vertical displacement.

Figure 2D:
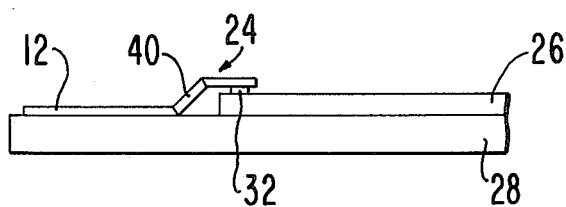

After the outer portions 12 have been bonded to the substrate 28, the carrier film 14 is excised, leaving the package as illustrated in FIG. 2D. Outer lead bonds may be formed and the package completed in a conventional manner.

The present invention is directed at a lead format which incorporates particular stretch loops which allow bonding of the lead frame to the integrated circuit prior to bonding the remainder of the frame to an offset substrate. The stretch loops of the present invention minimize the necessary spacing between adjacent leads to allow close packing of the leads and a corresponding high lead count in the resulting package.

Referring now to FIG. 3, prior art lead frames 40a were formed as rectangles having a pair of laterally extending segments 42 extending from each of two forks 44 formed in the lead 12. The laterally extending segments 42 are joined by axially aligned segments 46 to complete the rectangle. As the lead 12 is extended, the rectangle collapses causing segments 42 to realign in the axial direction. Thus, extension of the prior art loop 40a is limited to a distance equal to approximately twice the length of the segments 42, and for a given extension requirement, adjacent leads 12 can be spaced no closer than one-half the length of the extension.

The stretch loop of the present invention allows adjacent leads to be closely spaced for connection to high density integrated circuits having connection points which are closely spaced apart. It accomplishes this by providing a stretch loop having a plurality of segments wherein the segments which contribute to the elongation are axially aligned rather than laterally oriented, as in the prior art.

Referring to FIG. 4, a first embodiment 40b of the stretch loop comprises a pair of branches 50 which connect to forks 52 formed in each lead 12. Each branch includes a first segment 54 which is axially aligned with the lead 12 and connected to the lead by a pair of segments 56 which are also axially aligned with lead 12 and located between the lead and the first segment 54. The first segment 54 is connected at each end to the other segments 56 by short, arcuate sections 58. Similarly, the interior ends of the segments 56 are connected to the forks 52 by arcuate sections 60.

The width of the leads 12 will typically be in the range from 10 to 30 mils, depending on the density, more typically in the range from 20 to 25 mils. The width of the branches 50 will be approximately one-half the width of the lead, although the width may vary at points, typically narrowing through the arcuate sections 58, 60 to facilitate unfolding. The radius of such arcuate sections 58, 60 is preferably made as small as possible consistent with maintaining the ability to unfold. The inner radius $r_i$ (FIG. 4A) will typically be less than one-half the width of the branch 70, more typically less than one-quarter such width. Moreover, the arcuate sections 58 and 60 may have noncircular profiles, the only requirement being that such segments allow the loop 40b to unfold as the lead 12 is elongated.

Referring now also to FIGS. 4A–4C, as the lead 12 is offset during bonding to the substrate, an axial tension is experienced by the lead which draws the forks 52 apart. As the forks 52 move apart, segments 56 move from an axial alignment to a lateral alignment, as shown in FIG. 4B. As this occurs, the first segments 54 move laterally away from the center line of the lead 12, typically contacting and sliding by the adjacent lead. As the forks 52 continue to move apart, the segments 54 are drawn back toward the center and the lead 12 assumes a final configuration, as illustrated in FIG. 4C. The length of the first segment 54 can be increased as desired to increase the ultimate amount by which the loop 40b can elongate.

An alternate embodiment is illustrated in FIG. 5. A stretch loop 40c comprises a pair of forks 68 formed in the lead 12. Each fork 68 defines two branches 70, said branches extending between the forks. The forks 68 are spaced-apart a predetermined distance in the axial direction, and each branch 70 includes a first axial segment 72 having a length slightly less than said distance. The branch 70 is completed by additional axially aligned segments 74 and 76 which connect each end of the first segment 72 to the forks 68. Again, the width of each branch 72 is approximately one-half that of the lead 12 and, by closely spacing the various axial segments, it will be seen that the total width of the stretch loop 46c may approach as low as three times the width of the lead 12. This is true even though a total elongation equal to ten times the width of the lead, or more, may be provided.

The various axial segments 72, 74 and 76 of the branches 70 are connected by short, arcuate sections 78 and 80, as illustrated. The width of these sections will typically be somewhat less than that of the branches 70, to facilitate unfolding of the loop 40c. Moreover, by assuring that the loop 40c unfolds initially at sections 78 and 80 (typically by narrowing these sections relative to the remainder of the branch), the first axially aligned segments 72 unfold inward (as illustrated in FIGS. 5A-5E) to avoid interference between adjacent leads 12. If section 78 were stronger (i.e., more resistant to unfolding) than section 82 which defines the transition from the forks 68 to the segments 76, the loop 40c would initially unfold as indicated by arrows 84 (FIG. 5A), causing undesirable interference between adjacent leads 12.

As illustrated in both FIGS. 4 and 5, it is desirable that stretch loops 40 located on adjacent leads be axially staggered to allow the closest possible packing of the leads. By staggering, the leads may be spaced apart a distance approximately equal to the width of one branch of the stretch loop, rather than twice the width as would be required if the loops were placed laterally adjacent.

Although embodiments of this invention have been described above, these embodiments are intended to be illustrative of the invention, rather than limiting the invention, which is defined by the appended claims.

What is claimed is:

1. In an electrically conductive lead, a stretch loop including two forks which define a pair of branches, wherein each of said branches comprises a plurality of axially aligned segments connected by lateral segments which are shorter than said axially aligned segments, the sum of the lengths of said segments in each branch being greater than the distance between the forks so that the leads may be extended by applying a tensile force.

2. An electrically conductive lead as in claim 1, wherein said two branches lie symetrically about the axis of the lead.

3. An electrically conductive lead as in claim 1, wherein said lateral segments are arcuate in shape, having an inner radius not exceeding one half the width of the branch.

4. An electrically conductive lead as in claim 1, wherein preselected ones of said lateral segments have a diminished width, said ones chosen to effect a predetermined unfolding pattern of the stretch loop.

5. An electrically conductive lead as in claim 1, wherein each branch has a width equal to approximately one half the width of the lead and wherein said axially aligned segments are spaced apart by a distance less than one half the width of the lead.

6. A tape for use in tape automated bonding of electrically conductive leads to integrated circuits, said tape comprising:
    a carrier film having a plurality of frames defined by openings therethrough; and
    a multiplicity of said electrically conductive leads laminated to said carrier film at each frame and arranged so that a portion of each lead extends into said opening, each lead having a stretch loop including two forks which define a pair of branches, said stretch loop being located in said portion;
    said stretch loop being characterized by a plurality of axially aligned segments where the sum of the lengths of said axially-aligned segments in each branch is greater than the distance between the forks.

7. A tape as in claim 6, wherein each pair of branches lies symetrically about the axis of the lead.

8. A tape as in claim 6, wherein each branch comprises said axially aligned segments connected by lateral segments which are shorter than said axially aligned segments.

9. A tape as in claim 8, wherein said lateral segments are arcuate in shape, having an inner radius not exceeding one half the width of the branch.

10. A tape as in claim 9, wherein preselected ones of said lateral segments have a diminished width, said ones chosen to effect a predetermined unfolding pattern of the stretch loop.

11. A tape as in claim 6, wherein each branch has a width equal to approximately one-half the width of the lead and wherein said axially aligned segments are spaced apart by distance less than one half the width of the lead.

12. A tape as in claim 6, wherein stretch loops located on adjacent electrically conductive leads are staggered axially with respect to the lead so that the lateral extent of adjacent stretch loops do not interfere with one another.

13. A tape as in claim 6, wherein said forks on each stretch loop are closely spaced apart in the axial direction and wherein each branch comprises a first axial segment connected to the forks by second and third axial segments, the first axial segment having a length approximately equal to the sum of the lengths of the second and third axial segments.

14. A tape as in claim 13, wherein the second and third axial segments have approximately equal lengths.

15. A tape as in claim 6, wherein said forks on each stretch loop are spaced apart a predetermined distance in the axial direction and wherein each branch comprises a first axial segment having a length approximately equal to but slightly less than said predetermined distance, said first axial segment being connected to the forks by a pair of axially aligned segments at each end, the two segments in each pair having substantially equal lengths and the sum of the length of the first pair and the length of the second pair being substantially equal to the length of the first segment.

16. A tape as in claim 15, wherein the length of the two pairs are approximately equal.

* * * * *